(12) United States Patent
Jensen (10) Patent No.: US 7,242,336 B1
(45) Date of Patent: Jul. 10, 2007

(54) CONTINUOUS-TIME DELTA-SIGMA ADC FOR A RADIO RECEIVER EMPLOYING 200 KHZ IF

(75) Inventor: Henrik T. Jensen, Long Beach, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 11/369,045

(22) Filed: Mar. 6, 2006

(51) Int. Cl.
*H03M 3/00* (2006.01)

(52) U.S. Cl. ........................... 341/143; 341/155
(58) Field of Classification Search ............... 341/143, 341/155; 375/245; 310/322
See application file for complete search history.

(56) References Cited

U.S. PATENT DOCUMENTS

| | | | | |
|---|---|---|---|---|
| 5,327,130 A | * | 7/1994 | Kang et al. | 341/133 |
| 5,392,042 A | * | 2/1995 | Pellon | 341/143 |
| 6,075,820 A | * | 6/2000 | Comino et al. | 375/245 |
| 6,538,588 B1 | * | 3/2003 | Bazarjani | 341/143 |
| 7,176,817 B2 | * | 2/2007 | Jensen | 341/131 |
| 2004/0169437 A1 | * | 9/2004 | Orsier et al. | 310/322 |
| 2005/0146453 A1 | * | 7/2005 | Jensen | 341/131 |

* cited by examiner

*Primary Examiner*—Jean Bruner Jeanglaude
(74) *Attorney, Agent, or Firm*—Garlick Harrison & Markison; Holly L. Rudnick (57) ABSTRACT

A Continuous-Time Delta-Sigma Analog-to-Digital Converter (CTΔΣADC) for a radio frequency (RF) receiver employing a 200 kHz IF realizes an optimal signal-to-noise ratio using a programmable resonator that is set to resonate at 200 kHz. The programmable resonator is operably coupled to receive both an analog input signal at a low IF of 200 kHz and an analog feedback signal. From the analog input signal and the analog feedback signal, the programmable resonator produces a resonate signal at the low IF, and provides the resonate signal to a quantizer. The quantizer produces a digital output having a digital value coarsely reflecting an amplitude of the analog input signal. The CTΔΣADC further includes at least one programmable digital-to-analog converter (DAC) operably coupled to receive the digital output and to convert the digital output into the analog feedback signal provided to the programmable resonator.

24 Claims, 10 Drawing Sheets

CONTINUOUS-TIME DELTA-SIGMA ADC FOR A RADIO RECEIVER EMPLOYING 200 KHZ IF

BACKGROUND

1. Technical Field

The present invention relates to communication systems and, more particularly, to analog-to-digital converters used within transceivers.

2. Related Art

Communication systems are known to support wireless and wire lined communications between wireless and/or wire lined communication devices. Such communication systems range from national and/or international cellular telephone systems to the Internet to point-to-point in-home wireless networks. Each type of communication system is constructed, and hence operates, in accordance with one or more communication standard. For instance, wireless communication systems may operate in accordance with one or more standards, including, but not limited to, IEEE 802.11, Bluetooth, advanced mobile phone services (AMPS), digital AMPS, global system for mobile communications (GSM), code division multiple access (CDMA), local multi-point distribution systems (LMDS), multi-channel-multi-point distribution service (MMDS), and/or variations thereof.

Depending on the type of wireless communication system, a wireless communication device, such as a cellular telephone, two-way radio, personal digital assistant (PDA), personal computer (PC), laptop computer, home entertainment equipment, etc., communicates directly or indirectly with other wireless communication devices. For direct communications (also known as point-to-point communications), the participating wireless communication devices tune their receivers and transmitters to the same channel or channels (e.g., one of a plurality of radio frequency (RF) carriers of the wireless communication system) and communicate over that channel(s). For indirect wireless communications, each wireless communication device communicates directly with an associated base station (e.g., for cellular services) and/or an associated access point (e.g., for an in-home or in-building wireless network) via an assigned channel. To complete a communication connection between the wireless communication devices, the associated base stations and/or associated access points communicate with each other directly, via a system controller, via the public switched telephone network (PSTN), via the Internet, and/or via some other wide area network.

Each wireless communication device includes a built-in radio transceiver (i.e., receiver and transmitter) or is coupled to an associated radio transceiver (e.g., a station for in-home and/or in-building wireless communication networks, RF modem, etc.) that performs analog signal processing tasks as a part of converting data to a radio frequency (RF) signal for transmission and a received RF signal to data.

As is known, the transmitter includes a data modulation stage, one or more intermediate frequency stages, and a power amplifier. The data modulation stage converts raw data into baseband signals in accordance with the particular wireless communication standard. The one or more intermediate frequency stages mix the baseband signals with one or more local oscillations to produce RF signals. The power amplifier amplifies the RF signals prior to transmission via an antenna.

As is also known, the receiver is coupled to the antenna and includes a low noise amplifier, one or more intermediate frequency stages, a filtering stage, and a data recovery stage. The low noise amplifier receives an inbound RF signal via the antenna and amplifies it. The one or more intermediate frequency stages mix the amplified RF signal with one or more local oscillations to convert the amplified RF signal into a baseband signal or an intermediate frequency (IF) signal. As used herein, the term "low IF" refers to both baseband and intermediate frequency signals.

A filtering stage filters the low IF signals to attenuate unwanted out of band signals to produce a filtered signal. The data recovery stage recovers raw data from the filtered signal in accordance with the particular wireless communication standard. Alternate designs being pursued at this time further include direct conversion radios that produce a direct frequency conversion often in a plurality of mixing steps or stages.

As an additional aspect, these designs are being pursued as a part of a drive to continually reduce circuit size and power consumption. Along these lines, such designs are being pursued with CMOS technology thereby presenting problems not addressed by prior art designs. For example, one common design goal is to provide an entire system on a single chip. The drive towards systems-on-chip solutions for wireless applications continues to replace traditional analog signal processing tasks with digital processing to exploit the continued shrinkage of digital CMOS technology.

One approach is to reduce analog signal processing performance requirements and to compensate for the relaxed performance requirements in the digital domain to provide required system performance. This approach is beneficial in that, in addition to the reduced silicon area requirements, the digital processing is insensitive to process and temperature variations. Applications for which this trend is observed include RF receivers where the received signal is digitized as early as possible in the receiver chain using a high dynamic range analog-to-digital converter (ADC), and in a variety of calibration circuits of the radio where signal levels must be measured accurately over a wide range of values. This trend thus increases the demand for embedded low-power, low-voltage ADCs providing high dynamic range in the interface between the analog and digital processing.

A class of ADCs capable of providing high dynamic range and particularly suitable for low-power and low-voltage implementation is known as continuous-time delta sigma analog-to-digital converters (CTΔΣADCs). These ADCs can be designed to operate with supply voltages in the range of 1.2V–1.5V and current consumption as low as a few hundred μAs.

Figure 1:
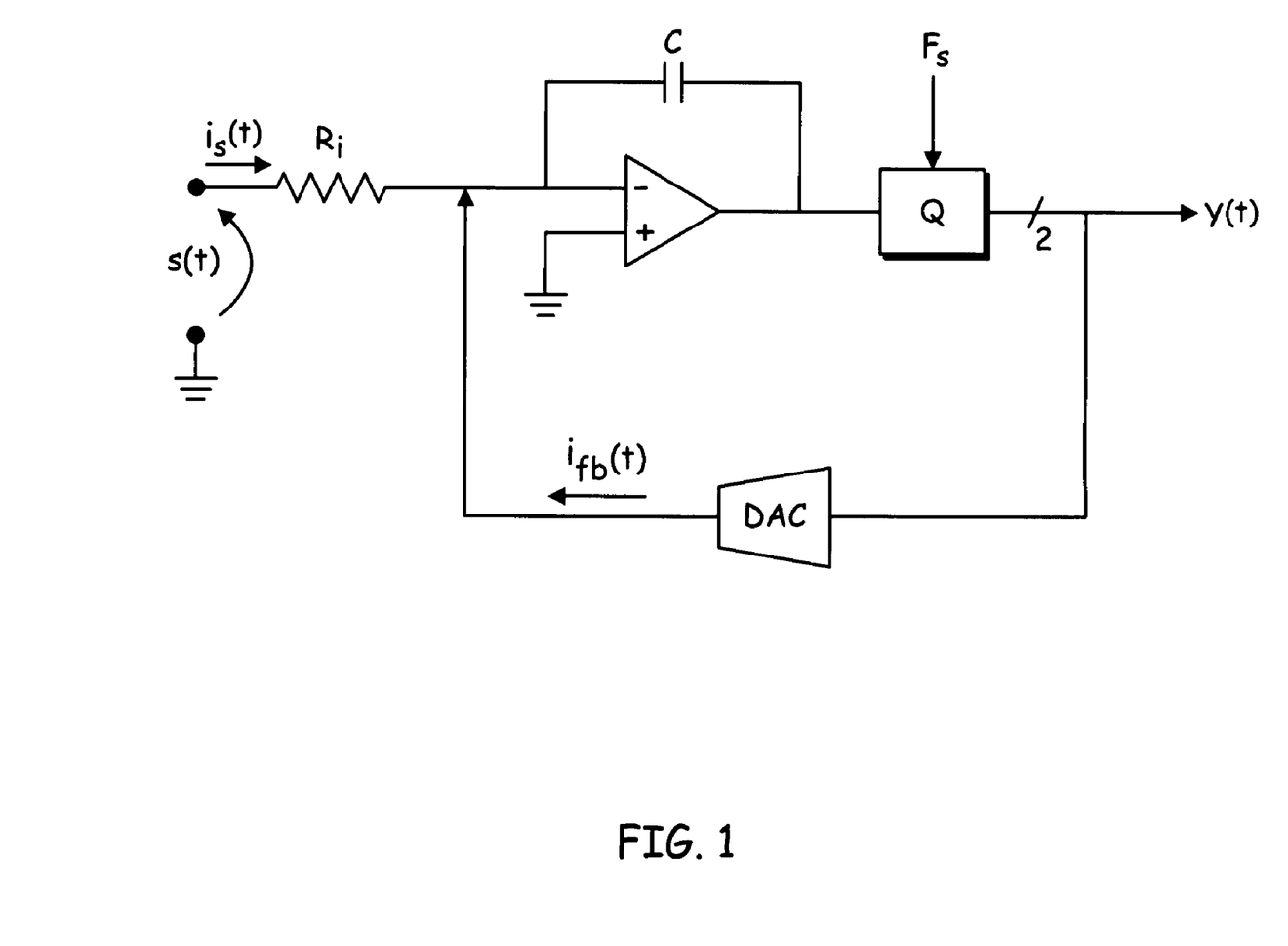
FIG. 1 shows an example top-level block diagram of a first-order low pass CTΔΣADC.

FIG. 1 shows an example top-level block diagram of the simplest CTΔΣADC, namely, the first-order low pass CTΔΣADC. The input signal to the CTΔΣADC of FIG. 1 is a voltage source labeled s(t). An operational amplifier with negative capacitive feedback constitutes an integrator formed by the operational amplifier and capacitor in a feedback loop, which integrates the input current labeled $i_s(t)$ flowing from an input signal s(t) to produce an analog integrator output voltage. A coarse (in this example 2-bit) quantizer converts the analog integrator output voltage signal to a digital format shown as y(t). The quantizer, by providing a 2-bit output, defines which of four voltage levels most closely match the analog integrator output voltage. More specifically, the quantizer produces a 2-bit output having values of 00, 01, 10 and 11.

Figure 2:
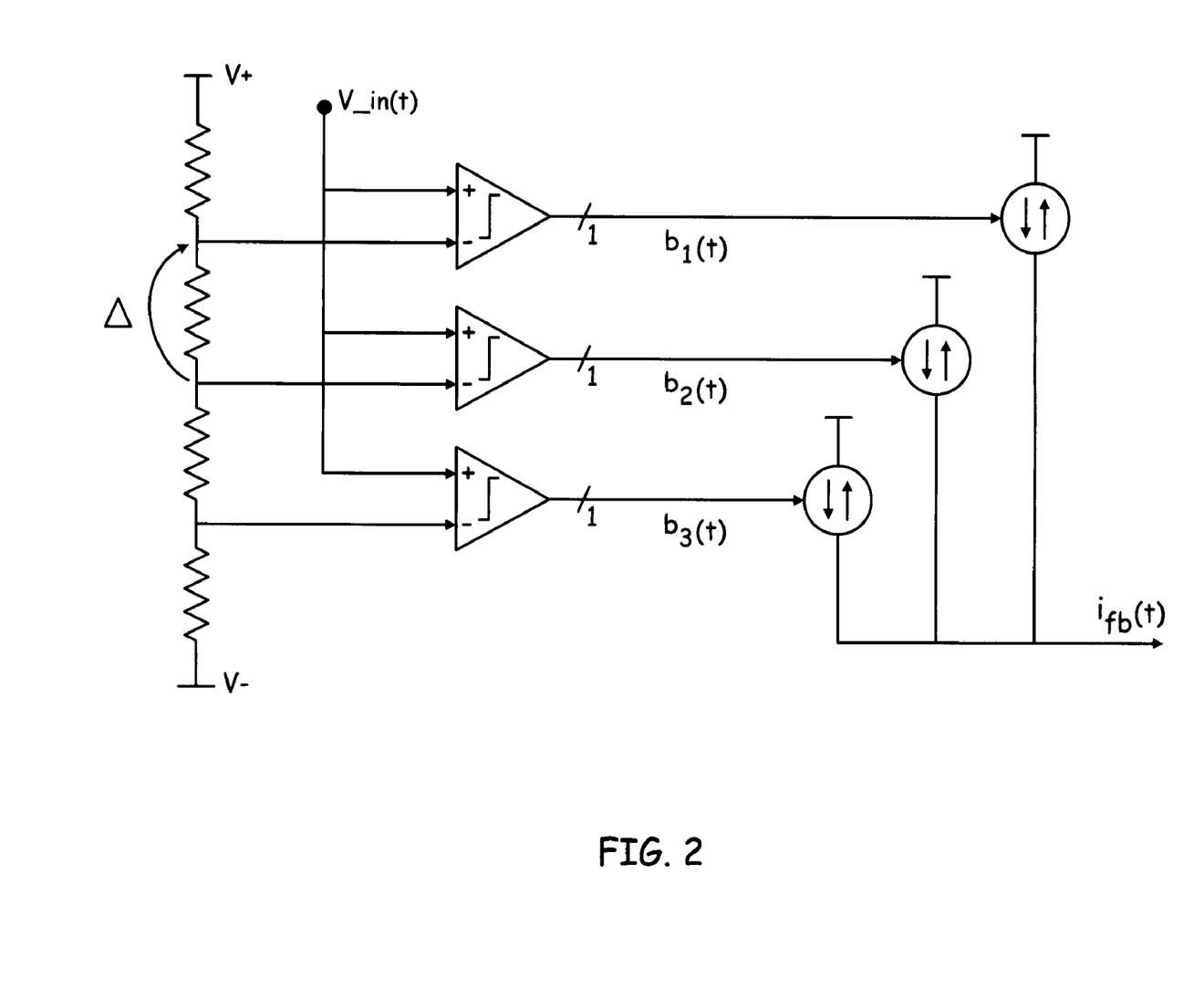
FIG. 2 shows one implementation of the 2-bit quantizer that produces a 2-bit feedback to a DAC.

The quantizer typically includes an array of comparators, essentially 1-bit ADCs, whose output is either "high" or "low" depending upon the magnitude of the integrator voltage relative to a reference signal generated by a reference generator. A digital-to-analog converter (DAC) provides a feedback current responsive to a logic value ("1" or "0") of ADC output to the integrator. FIG. 2 shows one implementation of the 2-bit quantizer that produces the 2-bit feedback to the DAC. The quantizer sums the output values of the array of comparators to produce the 2-bit output discussed above.

Figure 3:
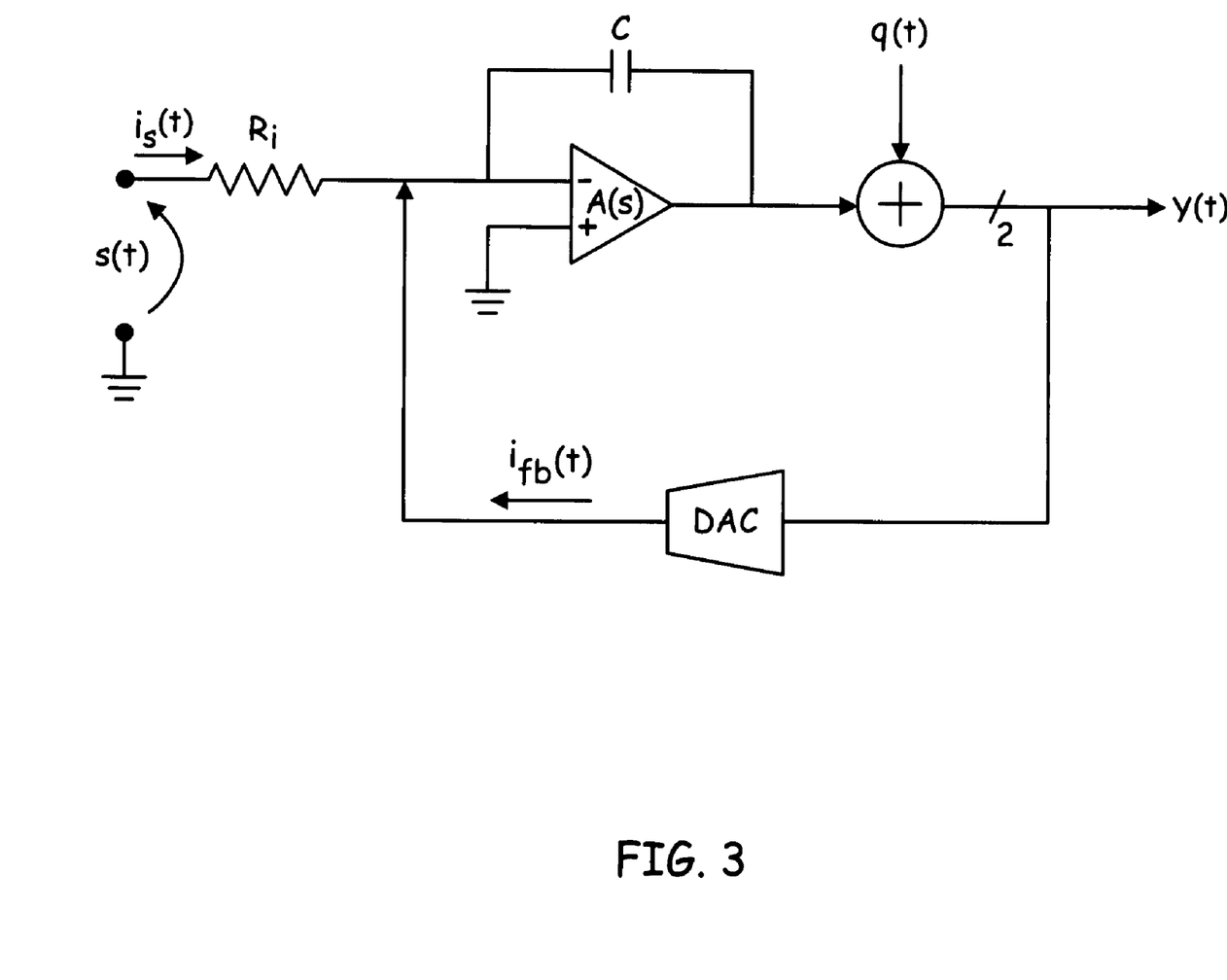
FIG. 3 shows an alternative model of the first-order CTΔΣADC that includes an additive noise source q(t)

FIG. 3 shows an alternative model of the first-order CTΔΣADC of FIG. 1, wherein the quantizer has been replaced with an additive noise source q(t). The model of FIG. 3 is one that represents the CTΔΣADC of FIG. 1. Because the operation of the quantizer is deterministic, a signal q(t) may be defined such that the CTΔΣADC of FIG. 3 behaves similarly to the CTΔΣADC of FIG. 1. The digital ADC output, here denoted y(t), can then be written as a sum of two terms, namely, a term related to the input signal, $y_s(t)$, and a term related to the quantization noise, $y_q(t)$, i.e., $$y(t)=y_s(t)+y_q(t). \tag{1}$$

By employing feedback around the integrator and quantizer combination, it is possible to suppress the quantization noise component $y_q(t)$ in a limited frequency range around DC. Specifically, it can be shown that $y_q(t)$ results from q(t) being filtered by a first-order high-pass filter, commonly referred to as the noise transfer function, NTF(s), i.e., in terms of Laplace transforms, $$Y_q(s)=NTF(s) \times Q(s). \tag{2}$$

Similarly, for a low-frequency input signal s(t), it can be shown that the signal component $y_s(t)$ equals the input signal, i.e., in terms of Laplace transforms, $$Y_s(s)=S(s). \tag{3}$$

The above properties explain the terminology "low pass" CTΔΣADC; if s(t) is a low frequency input signal, the ADC output y(t) closely resembles s(t) when considering only the low frequency region of y(t), i.e., the ADC "passes" signals of low frequency from analog to digital format without alteration. Furthermore, the low pass CTΔΣADC of FIG. 1 is of first-order since the single integrator gives rise to a first order high pass filter. More integrators can, in principle, be added to yield higher order filtering of the quantization noise as is described further below. Generally, an $N^{th}$ order CTΔΣADC contains N integrators.

Ideally, in equation (2), the quantization noise q(t) is uncorrelated with the input signal s(t) and closely resembles white noise of power $\Delta^2/12$, where $\Delta$ is the quantizer step size (see FIG. 2) as long as the input signal is limited such that the quantizer operates in the no-overload region. In this case, the two terms that constitute y(t) in equation (1) are uncorrelated, or, equivalently, $y_q(t)$ closely resembles white noise, uncorrelated with the input, and filtered by the high pass filter NTF(s). In this case, since NTF(s) is deterministic, the power of the quantization noise measured over a given signal band-width, $f_c$, of the ADC output y(t) can be determined using standard linear systems analysis as $$P_n = \int_{f=0}^{f=f_c} \frac{\Delta^2}{12} |NTF(e^{j2\pi f})|^2 \, df. \tag{4}$$

For a given known input signal power, $P_s$, the signal-to-noise ratio (SNR)—a measure of the quality of the analog-to-digital conversion process—can then be calculated a-priori according to $$SNR = \frac{P_s}{P_n}. \tag{5}$$

Some properties of the ideal CTΔΣADC, where q(t) resembles white and random noise, follow from (4) and (5). For a given fixed $f_c$, which depends upon the particular application, the SNR depends upon the input as would be expected from a linear system with q(t) contributing constant noise power at the output. In other words, any change of signal power leads to an identical change of SNR in the ADC output. For example, suppose that the signal power is doubled, e.g., increases by 6 dB, it then follows from (5) that the SNR increases by 6 dB.

Having a high SNR of the analog-to-digital converted signal is extremely important in almost all applications. Typically, the SNR delivered by the ADC must be within tight tolerances to satisfy strict performance and behavior requirements of the overall system. For example, SNR's less than 85 dB are undesirable in many applications such as RF receivers for cellular telephony including GSM and EDGE systems. In zero-IF and 100 kHz IF CTΔΣADCs, a digital filter is commonly used to achieve such a high SNR by filtering out frequency components above $f_c$ in the ADC output signal. However, existing approaches to achieving an SNR of 85 dB at zero-IF and 100 kHz IF cannot accommodate for an IF of 200 kHz while maintaining 85 dB SNR over the signal bandwidth. This is due to the fact that traditional CTΔΣADCs employ integrators, and are thus inherently designed for lowpass function. CTΔΣADCs that operate at 200 kHz IF provide several advantages over zero-IF or 100 kHz IF CTΔΣADCs, such as decreased receiver sensitivity to circuit flicker noise and circuit DC offset. Thus, a need exists for a CTΔΣADC architecture that optimizes the signal-to-noise ratio while operating at a low IF of 200 kHz.

SUMMARY OF THE INVENTION

The present invention is directed to apparatus and methods of operation that are further described in the following Brief Description of the Drawings, the Detailed Description of the Invention, and the claims. Other features and advantages of the present invention will become apparent from the following detailed description of the invention made with reference to the accompanying drawings.

BRIEF DESCRIPTION OF THE DRAWINGS

A better understanding of the present invention can be obtained when the following detailed description of the preferred embodiment is considered with the following drawings, in which.

DETAILED DESCRIPTION OF THE DRAWINGS

Figure 4:
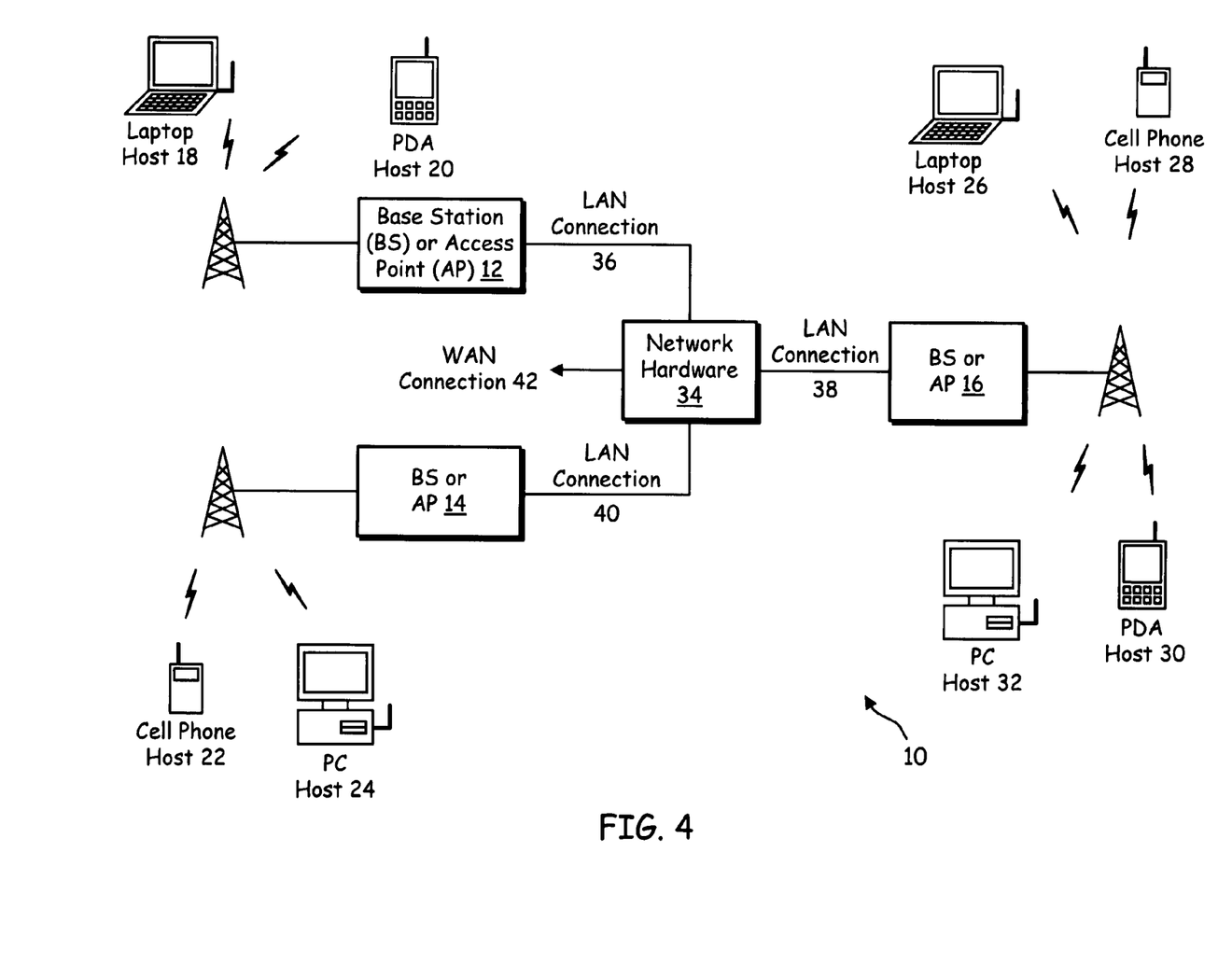
FIG. 4 is a functional block diagram illustrating a communication system that includes a plurality of base stations or access points, a plurality of wireless communication devices and a network hardware component.

FIG. 4 is a functional block diagram illustrating a communication system 10 that includes a plurality of base stations or access points 12–16, a plurality of wireless communication devices 18–32 and a network hardware component 34. The wireless communication devices 18–32 may be laptop host computers 18 and 26, personal digital assistant hosts 20 and 30, personal computer hosts 24 and 32 and/or cellular telephone hosts 22 and 28. The details of the wireless communication devices will be described in greater detail with reference to FIG. 5.

The base stations or access points 12–16 are operably coupled to the network hardware component 34 via local area network (LAN) connections 36, 38 and 40. The network hardware component 34, which may be a router, switch, bridge, modem, system controller, etc., provides a wide area network (WAN) connection 42 for the communication system 10. Each of the base stations or access points 12–16 has an associated antenna or antenna array to communicate with the wireless communication devices in its area. Typically, the wireless communication devices 18–32 register with the particular base station or access points 12–16 to receive services from the communication system 10. For direct connections (i.e., point-to-point communications), wireless communication devices communicate directly via an allocated channel.

Typically, base stations are used for cellular telephone systems and like-type systems, while access points are used for in-home or in-building wireless networks. Regardless of the particular type of communication system, each wireless communication device includes a built-in radio and/or is coupled to a radio. Any one of the wireless communication devices of FIG. 4 may employ the CTΔΣADC of the present invention as is described in greater detail below.

Figure 5:
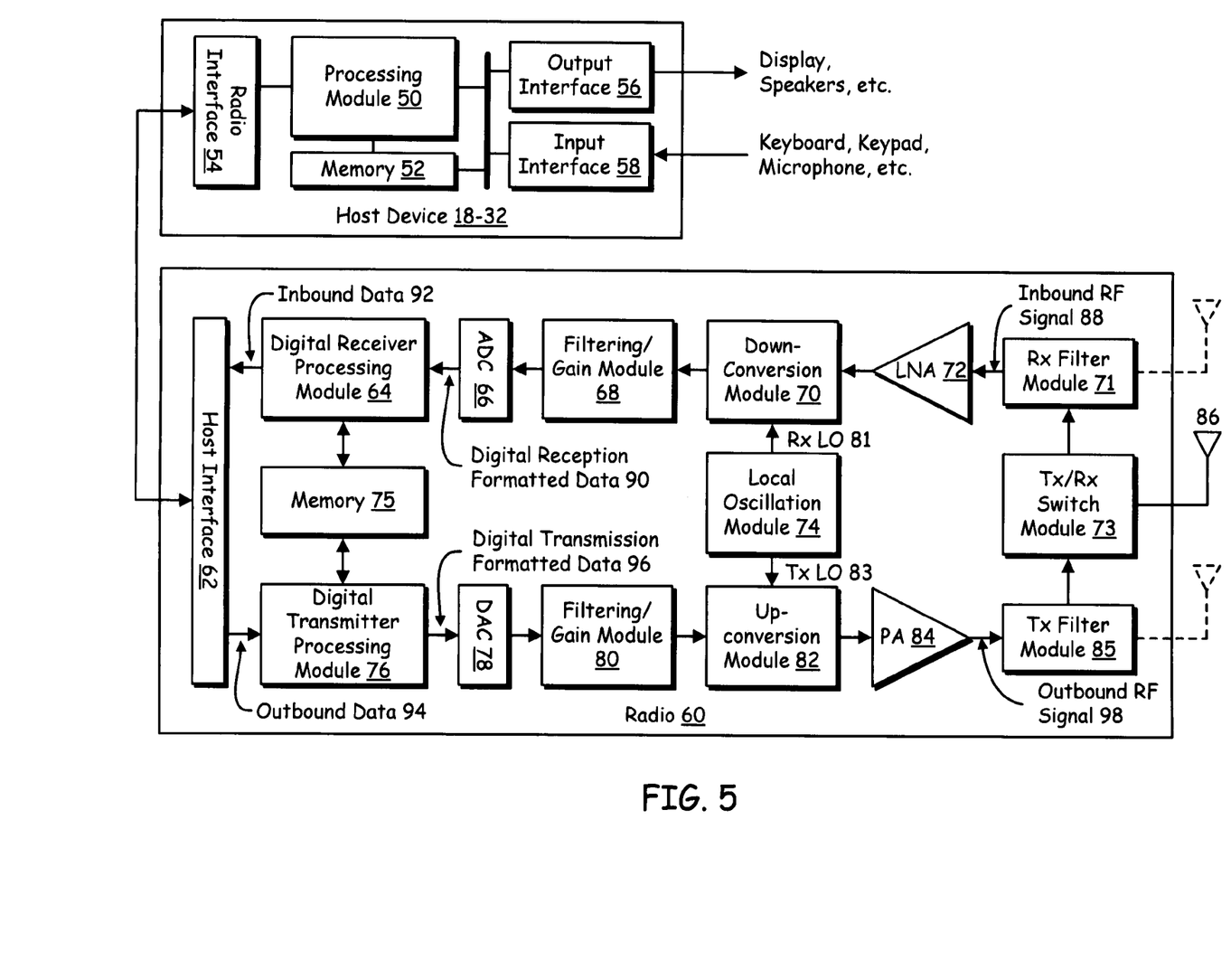
FIG. 5 is a schematic block diagram illustrating a wireless communication device that includes a host device and an associated radio.

FIG. 5 is a schematic block diagram illustrating a wireless communication device that includes the host device 18–32 and an associated radio 60. For cellular telephone hosts, the radio 60 is a built-in component. For personal digital assistants hosts, laptop hosts, and/or personal computer hosts, the radio 60 may be built-in or an externally coupled component.

As illustrated, the host device 18–32 includes a processing module 50, memory 52, a radio interface 54, an input interface 58 and an output interface 56. The processing module 50 and memory 52 execute the corresponding instructions that are typically done by the host device 18–32. For example, for a cellular telephone host device, the processing module 50 performs the corresponding communication functions in accordance with a particular cellular telephone standard.

The radio interface 54 allows data to be received from and sent to the radio 60. For data received from the radio 60 (e.g., inbound data), the radio interface 54 provides the data to the processing module 50 for further processing and/or routing to the output interface 56. The output interface 56 provides connectivity to an output device such as a display, monitor, speakers, etc., such that the received data may be displayed. The radio interface 54 also provides data from the processing module 50 to the radio 60. The processing module 50 may receive the outbound data from an input device, such as a keyboard, keypad, microphone, etc., via the input interface 58 or generate the data itself. For data received via the input interface 58, the processing module 50 may perform a corresponding host function on the data and/or route it to the radio 60 via the radio interface 54.

Radio 60 includes a host interface 62, a digital receiver processing module 64, an analog-to-digital converter 66, a filtering/gain module 68, a down-conversion module 70, a low noise amplifier 72, a receiver filter module 71, a transmitter/receiver (Tx/RX) switch module 73, a local oscillation module 74, memory 75, a digital transmitter processing module 76, a digital-to-analog converter 78, a filtering/gain module 80, an IF mixing up-conversion module 82, a power amplifier 84, a transmitter filter module 85, and an antenna 86. The antenna 86 is shared by the transmit and receive paths as regulated by the Tx/Rx switch module 73. The antenna implementation will depend on the particular standard to which the wireless communication device is compliant.

The digital receiver processing module 64 and the digital transmitter processing module 76, in combination with operational instructions stored in memory 75, execute digital receiver functions and digital transmitter functions, respectively. The digital receiver functions include, but are not limited to, demodulation, constellation demapping, decoding, and/or descrambling. The digital transmitter functions include, but are not limited to, scrambling, encoding, constellation mapping, and/or modulation. The digital receiver and transmitter processing modules 64 and 76, respectively, may be implemented using a shared processing device, individual processing devices, or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on operational instructions.

Memory 75 may be a single memory device or a plurality of memory devices. Such a memory device may be a read-only memory, random access memory, volatile memory, non-volatile memory, static memory, dynamic memory, flash memory, and/or any device that stores digital information. Note that when the digital receiver processing module 64 and/or the digital transmitter processing module 76 implements one or more of its functions via a state machine, analog circuitry, digital circuitry, and/or logic circuitry, the memory storing the corresponding operational instructions is embedded with the circuitry comprising the state machine, analog circuitry, digital circuitry, and/or logic circuitry. Memory 75 stores, and the digital receiver processing module 64 and/or the digital transmitter processing module 76 executes, operational instructions corresponding to at least some of the functions illustrated herein.

In operation, the radio 60 receives outbound data 94 from the host device 18–32 via the host interface 62. The host interface 62 routes the outbound data 94 to the digital transmitter processing module 76, which processes the outbound data 94 in accordance with a particular wireless communication standard (e.g., IEEE 802.11a, IEEE 802.11b, Bluetooth, etc.) to produce digital transmission formatted data 96. In accordance with embodiments of the present invention, the digital transmission formatted data 96 will be a digital low IF signal, where the low IF signal typically will be in the frequency range of one hundred kilohertz to 300 kilohertz.

The digital-to-analog converter 78 converts the digital transmission formatted data 96 from the digital domain to the analog domain. The filtering/gain module 80 filters and/or adjusts the gain of the analog low IF signal prior to providing it to the up-conversion module 82. The up-conversion module 82 directly converts the analog low IF signal into an RF signal based on a transmitter local oscillation 83 provided by local oscillation module 74. The power amplifier 84 amplifies the RF signal to produce an outbound RF signal 98, which is filtered by the transmitter filter module 85. The antenna 86 transmits the outbound RF signal 98 to a targeted device, such as a base station, an access point and/or another wireless communication device.

The radio 60 also receives an inbound RF signal 88 via the antenna 86, which was transmitted by a base station, an access point, or another wireless communication device. The antenna 86 provides the inbound RF signal 88 to the receiver filter module 71 via the Tx/Rx switch module 73, where the Rx filter module 71 bandpass filters the inbound RF signal 88. The Rx filter module 71 provides the filtered RF signal to low noise amplifier 72, which amplifies the inbound RF signal 88 to produce an amplified inbound RF signal. The low noise amplifier 72 provides the amplified inbound RF signal to the down-conversion module 70, which directly converts the amplified inbound RF signal into an inbound low IF signal (e.g., at 200 kHz IF) based on a receiver local oscillation 81 provided by local oscillation module 74. The down-conversion module 70 provides the inbound low IF signal to the filtering/gain module 68.

The analog-to-digital converter 66 converts the filtered inbound signal from the analog domain to the digital domain to produce digital reception formatted data 90. In accordance with embodiments of the present invention, the ADC 66 can be implemented as a CTΔΣADC operating at 200 kHz IF, as described in more detail below in connection with FIGS. 6–10. The digital receiver processing module 64 decodes, descrambles, demaps, and/or demodulates the digital reception formatted data 90 to recapture inbound data 92 in accordance with the particular wireless communication standard being implemented by radio 60. The host interface 62 provides the recaptured inbound data 92 to the host device 18–32 via the radio interface 54.

As one of average skill in the art will appreciate, the wireless communication device of FIG. 5 may be implemented using one or more integrated circuits. For example, the host device may be implemented on a first integrated circuit, while the digital receiver processing module 64, the digital transmitter processing module 76 and memory 75 may be implemented on a second integrated circuit, and the remaining components of the radio 60, less the antenna 86, may be implemented on a third integrated circuit. As an alternate example, the radio 60 may be implemented on a single integrated circuit. As yet another example, the processing module 50 of the host device 18–32 and the digital receiver processing module 64 and the digital transmitter processing module 76 may be a common processing device implemented on a single integrated circuit. Further, memory 52 and memory 75 may be implemented on a single integrated circuit and/or on the same integrated circuit as the common processing modules of processing module 50, the digital receiver processing module 64, and the digital transmitter processing module 76.

Figure 6:
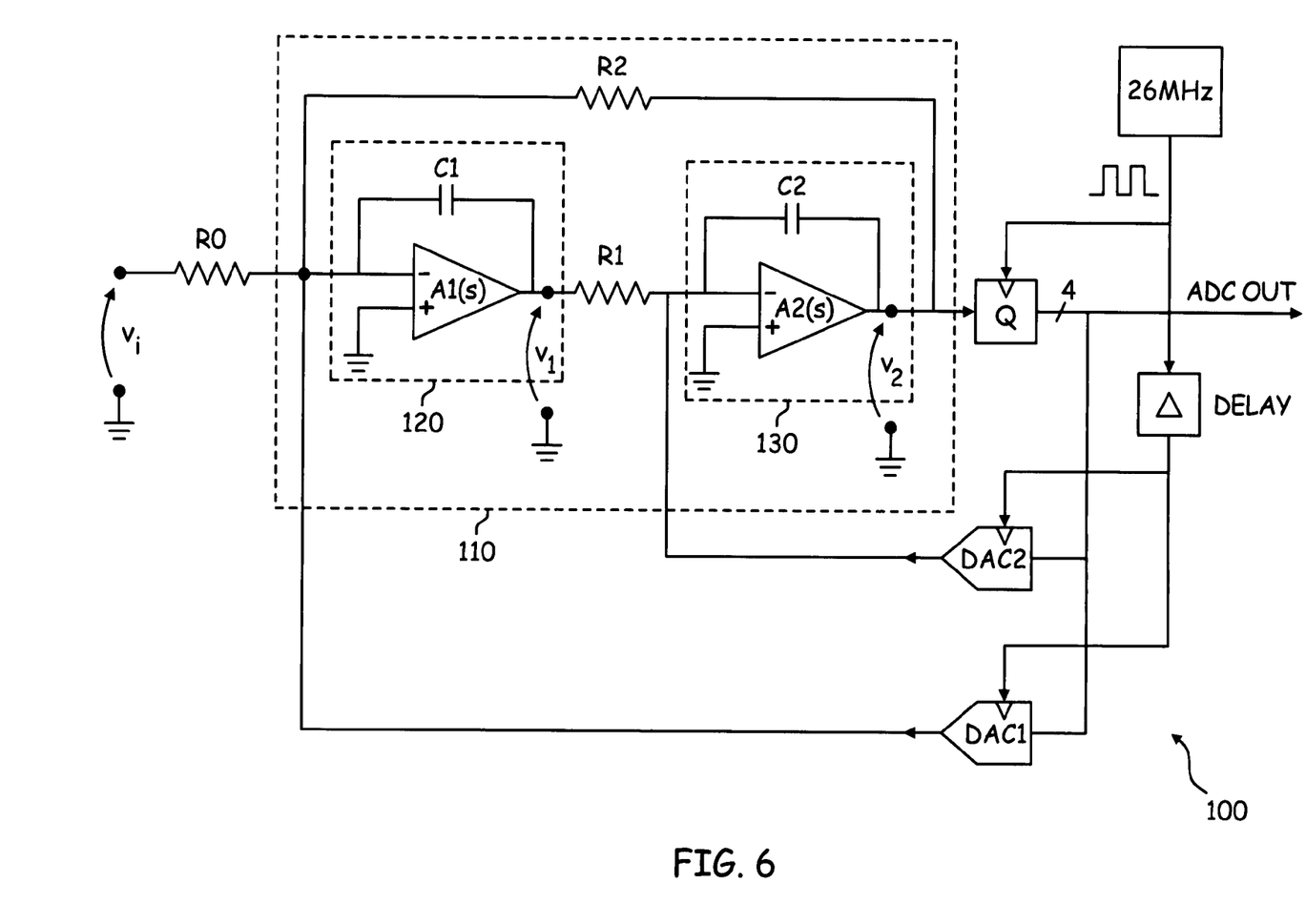
FIG. 6 is a functional single-ended schematic diagram of a CTΔΣADC capable of operating at 200 kHz IF formed according to one embodiment of the present invention.

FIG. 6 is a functional single-ended schematic diagram of a CTΔΣADC 100 formed according to one embodiment of the present invention. The single-ended CTΔΣADC 100 includes a variable resistor R0, a resonator 110, a quantizer Q, a delay element A and two programmable digital-to-analog converters DAC1 and DAC2 operably coupled to the resonantor 110 in a feedback loop. The resonator 110 includes operational amplifiers A1 and A2, programmable resistors R1 and R2 and programmable capacitors C1 and C2. Amplifier A1 is coupled with programmable capacitor C1 in a negative capacitive feedback loop to form a first integrator 120, while amplifier A2 is coupled with programmable capacitor C2 in a negative capacitive feedback loop to form a second integrator 130. Integrators 120 and 130 are operably coupled via programmable resistor R1 and programmable resistor R2. Programmable resistor R1 is operably coupled to an output of the first integrator 120 and to an input of the second integrator 130, while programmable resistor R2 is operably coupled to an input of the first integrator 120 and to an output of the second integrator 130.

In operation, an analog input signal $v_i$ is input to the variable resistor R0 prior to being coupled to a negative terminal of operational amplifier A1 of the first integrator 120 to produce a first analog integrator output voltage, $v_1$. The resistive value of R0 is selectably programmable and may be used to compensate for DC current components of the signal $v_i$ and to compensate for signal swing to avoid overloading the operational amplifier A1 based on changes in the input signal. The output voltage produced by the first integrator 120, denoted $v_1$, is the equal to the integral of the input voltage at the negative terminal of the operational amplifier A1, with a scaling factor equal to the capacitive value of C1. The integrated output of integrator 120 is coupled to programmable resistor R1 to produce an integrated input current, which is coupled to the negative terminal of operational amplifier A2 of the second integrator 130 to produce a second analog integrator output voltage, $v_2$. The output voltage of the second integrator 130, denoted $v_2$, is the equal to the integral of the input voltage at the negative terminal of the operational amplifier A2, with a scaling factor equal to the capacitive value of C2. The resistive values of R1 and R2 and the capacitive values of C1 and C2 are selectably programmable to optimize the signal-to-noise ratio (SNR) of the CTΔΣADC 100.

The integrated output of integrator 130 is the output of resonator 110. Thus, the integrated output of integrator 130 is a resonate signal that is resonate at the resonance frequency of the resonator 110. For a 200 kHz low IF input analog signal, the resonator 110 is set to resonate at approximately 200 kHz in order to produce the resonate signal at 200 kHz. The resonate signal output from resonator 110 is coupled to an input of a 4-bit quantizer Q. The quantizer Q samples the resonate signal on rising edges of a 26 MHz clock signal and quantizes the resonate signal to a 4-bit digital signal whose digital value coarsely reflects an amplitude of the analog input signal, $v_i$. The quantizer Q typically includes an array of comparators, essentially 1-bit ADCs, whose output is either "high" or "low" depending upon the magnitude of the second analog integrator output voltage relative to a reference signal generated by a reference generator (not shown). The output of the quantizer Q is the output of the CTΔΣADC 100.

To stabilize the CTΔΣADC, the ADC output is further coupled to digital-to-analog converters DAC1 and DAC2 to provide respective feedback currents responsive to a logic value ("1" or "0") of the ADC output. DAC1 and DAC2 each sample the ADC output on rising edges of a 26 MHz clock signal received via delay element Δ (e.g., 5 ns) to convert the ADC output to respective analog feedback signals. Implicit in DAC1 and DAC2 is a respective scaling factor that constitutes a feedback coefficient selected to optimize the SNR of the CTΔΣADC 100. Thus, each DAC (DAC1 and DAC2) is programmed with a respective feedback coefficient whose values are selected to produce respective feedback current magnitudes that substantially cancel a quantization noise component present in the ADC output.

Tables 1 and 2 below illustrate exemplary values for each of the programmable elements of the CTΔΣADC, selected to optimize the SNR of the CTΔΣADC to 85 dB.

TABLE 1

| Full Scale $v_i$ | R0 | R1 | R2 | C1 | C2 |
|---|---|---|---|---|---|
| 260 mV | 5.0 kΩ | 3.626 kΩ | −552.873 kΩ | 25.0 pF | 10.0 pF |

TABLE 2

| DAC1 Nominal Full Scale Feedback Current | DAC2 Nominal Full Scale Feedback Current |
|---|---|
| −60.0 μA | 100.0 μA |

Thus, with a full scale analog input signal, $v_i$, of 260 mV at 200 kHz IF with a bandwidth of 200 kHz, in order to produce an SNR of 85 dB, the resistive value of R0 is approximately 5.0 kΩ, the resistive value of R1 is approximately 3.6 kΩ, the resistive value of R2 is approximately −552 kΩ, the capacitive value of C1 is approximately 25 pF and the capacitive value of C2 is approximately 10.0 pF. In general, depending on the IF chosen for the RF receiver, the respective values of R1 and R2 are between 100Ω and 1Ω, and the respective values of C1 and C2 are between 1 pF and 100 pF in order to optimize the SNR of the CTΔΣADC.

Figure 7:
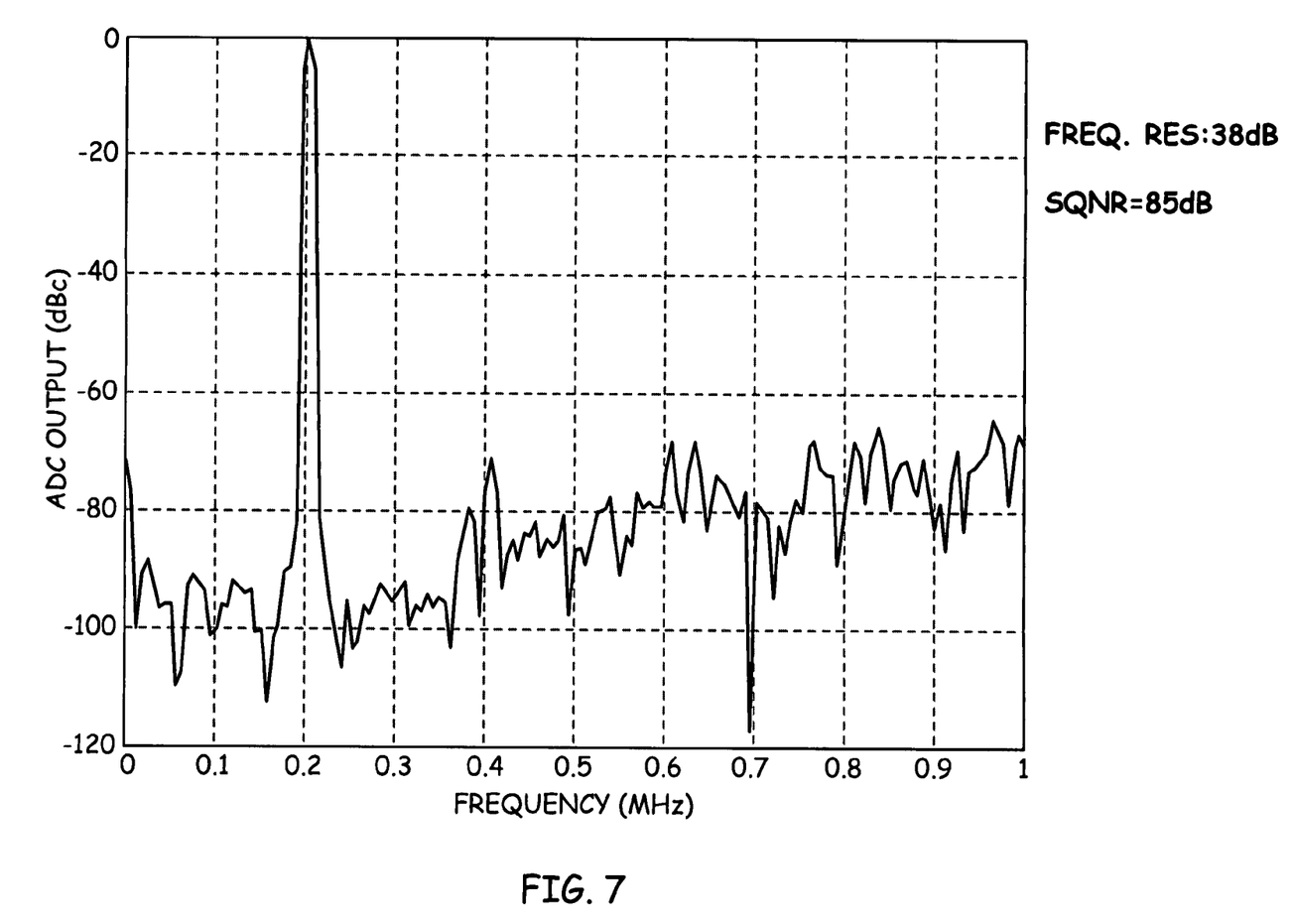
FIG. 7 shows the simulated SNR of the single-ended CTΔΣADC over a 200 kHz bandwidth.

FIG. 7 shows the simulated SNR of a CTΔΣADC programmed with the values listed in Tables 1 and 2 above over a 200 kHz bandwidth. For a large range of input voltages, the SNR (measured in dB) increases linearly with input power measured in dB, as desired. At some point, around an input voltage of 260 mV, the ADC overloads, and the SNR decreases rapidly with increasing input amplitude. Thus, the peak SNR of this ADC is approximately 85 dB and is reached with an input amplitude of 260 mV. This signal level is referred to as the full scale signal. As can be seen in FIG. 7, for a full scale signal, the peak SNR is reached at 200 kHz and the surrounding noise floor produces a quantization noise shaping notch at 200 kHz over a 200 kHz bandwidth.

Figure 8:
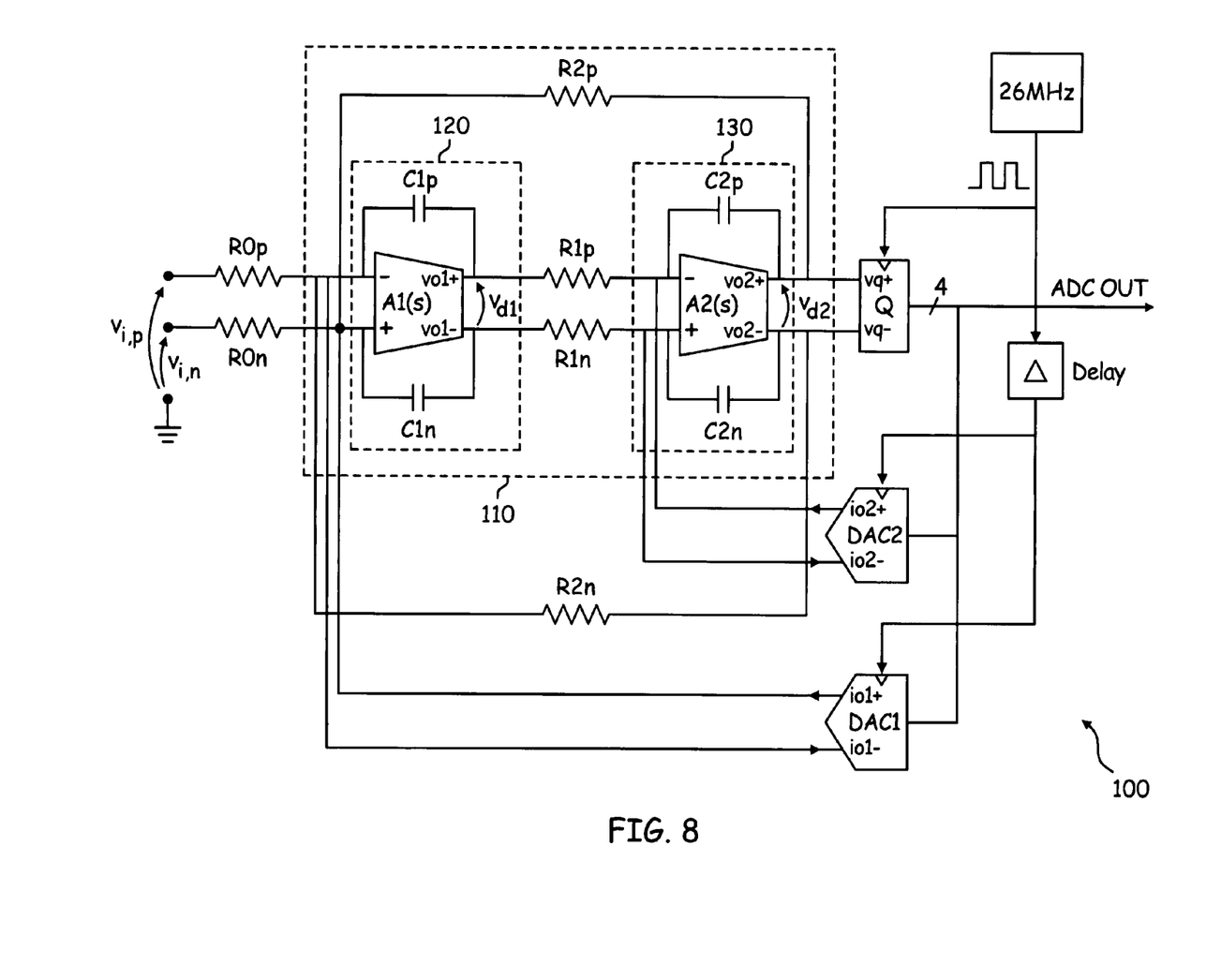
FIG. 8 is a functional differential schematic diagram of a CTΔΣADC capable of operating at 200 kHz IF formed according to one embodiment of the present invention.

FIG. 8 is a functional differential schematic diagram of a CTΔΣADC 100 capable of operating at 200 kHz IF formed according to one embodiment of the present invention. The differential signal model is equivalent to the single-ended model shown in FIG. 6, but rather than grounding one of the terminals of the operational amplifiers A1 and A2, one of the terminals is at positive potential and the other terminal is at negative potential to reduce common noise inherent in the CTΔΣADC (e.g., noise due to circuit operational mode or conditions). Thus, as in FIG. 6, the CTΔΣADC 100 shown in FIG. 8 includes the resonator 110, the quantizer Q clocked by the 26 MHz clock signal, the two programmable digital-to-analog converters DAC1 and DAC2 and a delay element Δ operably coupled to delay the 26 MHz clock signal to DAC1 and DAC2. In addition, as in FIG. 6, DAC1 and DAC2 are operably coupled to the resonantor 110 in a feedback loop.

However, in the differential model shown in FIG. 8, the CTΔΣADC 100 includes variable resistors R0$p$ and R0$n$, each providing a respective input voltage to a respective terminal of the first operational amplifier A1 of the resonator 110. The resonator 110 further includes programmable resistors R1$p$ and R1$n$, each operably coupled to respective positive or negative terminals, respectively, of operational amplifiers A1 and A2, programmable resistors R2$p$ and R2$n$, each operably coupled to respective positive or negative terminals, respectively, of operational amplifiers A1 and A2, programmable capacitors C1$p$ and C1$n$, each operably coupled to respective positive or negative terminals, respectively, of operational amplifier A1, and programmable capacitor C2$p$ and C2$n$, each operably coupled to respective positive or negative terminals, respectively, of operational amplifier A2.

Thus, operational amplifier A1 is coupled with programmable capacitors C1$p$ and C1$n$ in a negative capacitive feedback loop to form the first integrator 120, while operational amplifier A2 is coupled with programmable capacitors C2$p$ and C2$n$ in a negative capacitive feedback loop to form the second integrator 130. Integrators 120 and 130 are operably coupled via programmable resistors R1$p$ and R1$n$ and programmable resistors R2$p$ and R2$n$. For example, programmable resistor R1$p$ is operably coupled to a positive output terminal of operational amplifier A1 and to a negative input terminal of operational amplifier A2, while programmable resistor R1$n$ is operably coupled to a negative output terminal of operational amplifier A1 and to a positive input terminal of operational amplifier A2. In addition, programmable resistor R2$p$ is operably coupled across the positive and negative input terminals of operational amplifier A1 and to a positive output terminal of operational amplifier A2, while programmable resistor R2$n$ is operably coupled across the positive and negative input terminals of operational amplifier A1 and to a negative output terminal of operational amplifier A2.

In operation, differential analog input signals $v_{i,p}$ and $v_{i,n}$ are input to the variable resistors R0$p$ and R0$n$, respectively, prior to being coupled to negative and positive terminals, respectively, of operational amplifier A1 of the first integrator 120. The outputs of the first integrator 120 produce a first analog integrator output voltage, $v_{d1}$, which is equal to the integral of the difference in input voltages at the negative and positive terminals of the operational amplifier A1, with scaling factors equal to the capacitive values of C1$p$ and C1$n$. The integrated outputs of integrator 120 is coupled to programmable resistors R1$p$ and R1$n$ to produce respective integrated input currents that are coupled to the negative and positive terminals, respectively, of operational amplifier A2 of the second integrator 130. The outputs of the second integrator 130 produce a second analog integrator output voltage, denoted $v_{d2}$, which is the equal to the integral of the difference in input voltages at the negative and positive terminals of the operational amplifier A2, with scaling factors equal to the capacitive values of C2$p$ and C2$n$.

The integrated outputs of integrator 130 are the outputs of resonator 110. Thus, the integrated outputs of integrator 130 are resonate signals that are resonate at the resonance frequency of the resonator 110. For a 200 kHz low IF input analog signal, the resonator 110 is set to resonate at 200 kHz in order to produce the resonate signals at 200 kHz. The resonate signals output from resonator 110 are coupled to the input of the 4-bit quantizer Q. As in FIG. 6, the quantizer Q samples the resonate signals on rising edges of a 26 MHz clock signal and quantizes the resonate signals to a 4-bit digital signal whose digital value coarsely reflects an amplitude of the differential analog input signals, $v_{i,p}$ and $v_{i,n}$. The output of the quantizer Q is the output of the CTΔΣADC 100, which is coupled to digital-to-analog converters DAC1 and DAC2 to provide respective feedback currents to the positive and negative terminals of each operational amplifier A1 and A2. As in the single-ended model shown in FIG. 6, the resistive values of R0$p$, R0$n$, R1$p$, R1$n$, R2$p$ and R2$n$, the capacitive values of C1$p$, C1$n$, C2$p$ and C2$n$ and the feedback coefficients of DAC1 and DAC2 are selectably programmable to optimize the signal-to-noise ratio (SNR) of the CTΔΣADC 100.

Tables 3 and 4 below illustrate exemplary values for each of the programmable elements of the differential CTΔΣADC, selected to optimize the SNR of the CTΔΣADC to 85 dB.

TABLE 3

| Full Scale ($v_{i,p}$–$v_{i,n}$) | R0p,n | R1p,n | R2p,n | C1 | C2 |
|---|---|---|---|---|---|
| 520 mV | 10.0 kΩ | 7.251 kΩ | 1,105.746 kΩ | 12.5 pF | 5.0 pF |

TABLE 4

| DAC1 Nominal Full Scale Feedback Current, io1+–io1– | DAC2 Nominal Full Scale Feedback Current, io2+–io2– |
|---|---|
| 60.0 µA | 100.0 µA |

As can be seen in Tables 2 and 3 above, when compared to Tables 1 and 2, all of the resistive values are doubled, while all of the capacitive values are halved. Thus, with a full scale analog input signal, ($v_{i,p}$–$v_{i,n}$) of 520 mV at 200 kHz IF with a bandwidth of 200 kHz, in order to produce an SNR of 85 dB, the resistive values of R0$p$ and R0$n$ are approximately 10.0 kΩ, the resistive values of R1$p$ and R1$n$ are approximately 7.2 kΩ, the resistive values of R2$p$ and R2$n$ are approximately 1,106 kΩ, the capacitive values of C1$p$ and C1$n$ are approximately 12.5 pF and the capacitive values of C2$p$ and C2$n$ are approximately 5.0 pF.

Figure 9:
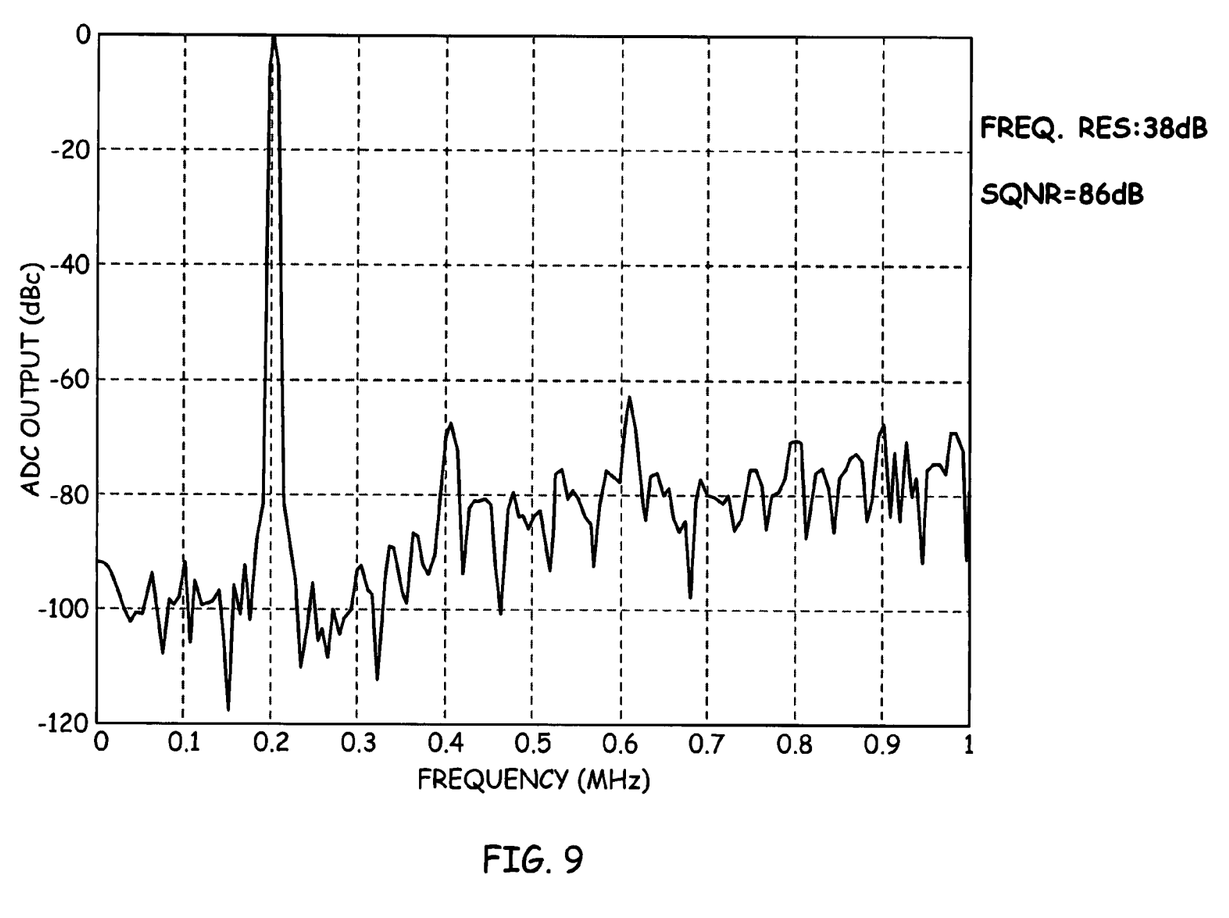
FIG. 9 shows the simulated SNR of the differential CTΔΣADC over a 200 kHz bandwidth.

FIG. 9 shows the simulated SNR of the differential CTΔΣADC programmed with the values listed in Tables 3 and 4 above over a 200 kHz bandwidth. Similar to FIG. 7, the peak SNR of this ADC is approximately 85 dB, which is reached with an input amplitude of 520 mV and an input frequency of 200 kHz. In addition, as in FIG. 7, the surrounding noise floor produces a quantization noise shaping notch at 200 kHz over a 200 kHz bandwidth.

Figure 10:
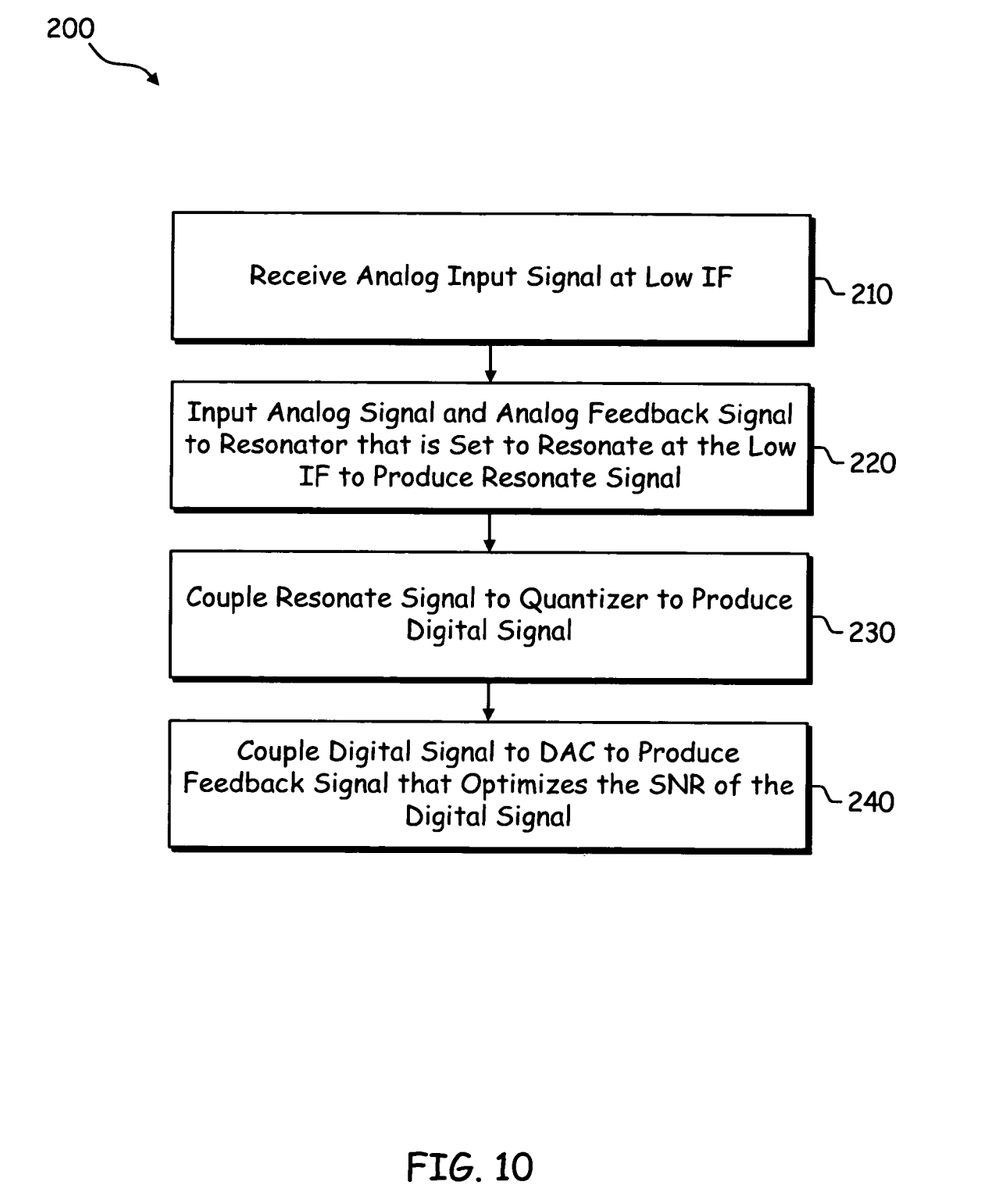
FIG. 10 is a flow chart illustrating an exemplary process for operating the CTΔΣADC of the present invention.

FIG. 10 is a flow chart illustrating an exemplary process 200 for operating the CTΔΣADC of the present invention. The process 200 begins at step 210, where both an analog input signal at a low IF (e.g., 200 kHz) at an input of a single-ended or differential CTΔΣADC. At step 220, the analog input signal and an analog feedback signal are input to a programmable resonator that is set to resonate at the low IF to produce a resonate signal. The method continues at step 230, where the resonate signal is coupled to a quantizer to produce a digital signal from the resonate signal. For example, the quantizer may sample the resonate signal on rising edges of a clock signal and quantize the resonate signal to a 4-bit digital signal whose digital value coarsely reflects an amplitude of the analog input signal. Finally, at step 240, the digital signal output from the quantizer is coupled to at least one digital-to-analog converter (DAC) to produce the analog feedback signal that operates, in conjunction with the programmable resonator, to optimize the SNR of the digital signal.

As one of average skill in the art will appreciate, the term "substantially" or "approximately", as may be used herein, provides an industry-accepted tolerance to its corresponding term. Such an industry-accepted tolerance ranges from less than one percent to twenty percent and corresponds to, but is not limited to, component values, integrated circuit process variations, temperature variations, rise and fall times, and/or thermal noise. As one of average skill in the art will further appreciate, the term "operably coupled", as may be used herein, includes direct coupling and indirect coupling via another component, element, circuit, or module where, for indirect coupling, the intervening component, element, circuit, or module does not modify the information of a signal but may adjust its current level, voltage level, and/or power level. As one of average skill in the art will also appreciate, inferred coupling (i.e., where one element is coupled to another element by inference) includes direct and indirect coupling between two elements in the same manner as "operably coupled".

While the invention is susceptible to various modifications and alternative forms, specific embodiments thereof have been shown by way of example in the drawings and detailed description. It should be understood, however, that the drawings and detailed description thereto are not intended to limit the invention to the particular form disclosed, but, on the contrary, the invention is to cover all modifications, equivalents and alternatives falling within the spirit and scope of the present invention as defined by the claims. As may be seen, the described embodiments may be modified in many different ways without departing from the scope or teachings of the invention.

What is claimed is:

1. A Continuous-Time Delta-Sigma Analog-to-Digital Converter (CTΔΣADC) coupled to receive an analog input signal at a low intermediate frequency (IF), the CTΔΣADC for producing a digital output based on the received analog signal, wherein the CTΔΣADC comprises:

a programmable resonator that is set to resonate at the low IF and operably coupled to receive the analog input signal at the low IF and an analog feedback signal to produce a resonate signal at the low IF;

a quantizer operably coupled to receive the resonate signal and operable to produce the digital output having a digital value coarsely reflecting an amplitude of the analog input signal; and and at least one programmable digital-to-analog converter (DAC) operably coupled to receive the digital output and to convert the digital output into the analog feedback signal.

2. The CTΔΣADC of claim 1, wherein said programmable resonator comprises:

a first programmable integrator operably coupled to receive the analog input signal at the low IF and operable to produce a first integrated output;

a first programmable resistive element operably coupled to receive the first integrated output and operable to produce an integrated input current;

a second programmable integrator operably coupled to receive the integrated input current and operable to produce a second integrated output as the resonate signal; and a second programmable resistive element operably coupled to an input of said first integrator and an output of said second integrator.

3. The CTΔΣADC of claim 2, wherein respective values of the first programmable resistive element and the second programmable resistive element are selected to optimize a signal-to-noise ratio of the digital output.

4. The CTΔΣADC of claim 3, wherein said first programmable integrator comprises a first op-amp operably coupled with a first programmable capacitive element in a first negative capacitive feedback loop and said second programmable integrator comprises a second op-amp operably coupled with a second programmable capacitive element in a second negative capacitive feedback loop.

5. The CTΔΣADC of claim 4, wherein respective values of the first programmable capacitive element and the second programmable capacitive element are selected to optimize the signal-to-noise ratio of the digital output.

6. The CTΔΣADC of claim 5, wherein the low IF is approximately 200 kHz with a bandwidth of approximately 200 kHz and the signal-to-noise ratio is optimized to at least 85 dB over the bandwidth.

7. The CTΔΣADC of claim 6, wherein the value of the first resistive element is approximately 3.6 kΩ, the value of the second resistive element is approximately −552 kΩ, the value of the first capacitive element is approximately 25 pF and the value of the second capacitive element is approximately 10 pF.

8. The CTΔΣADC of claim 5, wherein the respective values of the first resistive element and the second resistive element are between approximately 100Ω and approximately 1 MΩ, and the respective values of the first capacitive element and the second capacitive element are between approximately 1 pF and approximately 100 pF.

9. The CTΔΣADC of claim 2, wherein said at least one programmable digital-to-analog converter (DAC) comprises:

a first programmable DAC operably coupled to receive the digital output and operable to provide the analog feedback signal to an input of the first integrator; and a second programmable DAC operably coupled to receive the digital output and operable to provide an additional feedback signal to an input of the second integrator.

10. The CTΔΣADC of claim 9, wherein each of said first programmable DAC and said second programmable DAC comprises a respective feedback coefficient whose values are selected to produce respective programmable feedback current magnitudes that substantially cancel a quantization noise component present in the digital output.

11. The CTΔΣADC of claim 9, wherein the feedback current magnitude produced by said first programmable DAC is approximately −60 μA and the feedback current magnitude produced by said second programmable DAC is approximately 100 μA.

12. The CTΔΣADC of claim 1, wherein said quantizer is operably coupled to receive a clock signal, and is further operable to sample the resonate signal at rising edges of the clock signal to quantize the resonate signal to a 4-bit digital output.

13. The CTΔΣADC of claim 12, wherein the clock signal is at 26 MHz.

14. The CTΔΣADC of claim 12, further comprising:

a delay element operably coupled to receive the digital output and operable to provide a delayed digital output to said at least one programmable DAC.

15. The CTΔΣADC of claim 1, further comprising:

a selectable value input resistive element operably coupled to receive the analog input signal and to produce an input current to the resonator, wherein the input current is proportional to the received analog input signal.

16. A method for operating a programmable Continuous-Time Delta-Sigma Analog-to-Digital Converter (CTΔΣADC), the method comprising:

receiving an analog input signal at an input of the CTΔΣADC;

coupling the analog input signal and a feedback signal to a programmable resonator that is set to resonate at the low IF to produce a resonate signal at the low IF;

coupling the resonate signal to a quantizer to produce a digital signal representative of the analog input signal; and coupling the digital signal to a programmable digital-to-analog converter (DAC) to produce the feedback signal.

17. The method of claim 16, wherein said coupling the analog input signal and the feedback signal to the programmable resonator further comprises:

coupling the analog input signal at the low IF to a first programmable integrator to produce a first integrated output;

coupling the first integrated output to a first resistive element to produce an integrated input current;

coupling the integrated input current to a second integrator to produce a second integrated output as the resonate signal; and coupling an input of said first integrator and an output of said second programmable integrator to a second resistive element.

18. The method of claim 17, wherein said coupling the analog input signal to the first programmable integrator further includes coupling the analog input signal to a first op-amp operably coupled with a first programmable capacitive element in a first negative capacitive feedback loop and said coupling the integrated input current to the second programmable integrator further includes coupling the integrated input current to a second op-amp operably coupled with a second programmable capacitive element in a second negative capacitive feedback loop.

19. The method of claim 18, further comprising:

selecting respective values of the first programmable resistive element, the second programmable resistive element, the first programmable capacitive element and the second programmable capacitive element to optimize a signal-to-noise ratio of the digital output.

20. The method of claim 19, wherein the low IF is approximately 200 kHz with a bandwidth of approximately 200 kHz and the signal-to-noise ratio is optimized to at least 85 dB over the bandwidth.

21. The method of claim 17, wherein said coupling the digital signal to the programmable DAC comprises:

coupling the digital signal to a first programmable DAC to provide the analog feedback signal to an input of the first integrator; and coupling the digital signal to a second programmable DAC to provide an additional feedback signal to an input of the second integrator.

22. The method of claim 21, further comprising:

selecting a respective feedback coefficient of said first programmable DAC and said second programmable DAC to produce respective programmable feedback current magnitudes that substantially cancel a quantization noise component present in the digital output.

23. The method of claim 16, wherein said quantizing further comprises:

sampling the resonate signal at rising edges of a clock signal to quantize the resonate signal to a 4-bit digital output.

24. The method of claim 16, further comprising:

selecting and coupling a programmable input resistance value between the CTΔΣADC input and an input of the resonator.

* * * * *